(12) United States Patent
Lv et al.

(10) Patent No.: US 12,243,808 B2
(45) Date of Patent: Mar. 4, 2025

(54) CHIP SCALE PACKAGE (CSP) SEMICONDUCTOR DEVICE HAVING THIN SUBSTRATE

(71) Applicant: ALPHA AND OMEGA SEMICONDUCTOR INTERNATIONAL LP, Toronto (CA)

(72) Inventors: Lin Lv, Shanghai (CN); Shuhua Zhou, Shanghai (CN); Long-Ching Wang, Cupertino, CA (US); Jun Lu, San Jose, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 334 days.

(21) Appl. No.: 17/701,695

(22) Filed: Mar. 23, 2022

(65) Prior Publication Data

US 2023/0307325 A1 Sep. 28, 2023

(51) Int. Cl.
*H01L 23/482* (2006.01)
*H01L 23/29* (2006.01)
*H01L 23/00* (2006.01)
*H01L 27/088* (2006.01)

(52) U.S. Cl.
CPC ........ *H01L 23/4827* (2013.01); *H01L 23/295* (2013.01); *H01L 24/05* (2013.01); *H01L 27/088* (2013.01); *H01L 2224/05644* (2013.01); *H01L 2224/05655* (2013.01); *H01L 2924/10253* (2013.01)

(58) Field of Classification Search
None
See application file for complete search history.

(56) References Cited

U.S. PATENT DOCUMENTS

| | | | |
|---|---|---|---|
| 8,642,397 B1 * | 2/2014 | Gong | H01L 23/3121 257/676 |
| 8,981,464 B2 | 3/2015 | Feng et al. | |
| 9,093,522 B1 | 7/2015 | Zeng et al. | |
| 9,941,210 B1 * | 4/2018 | Viswanathan | H01L 23/481 |
| 10,777,475 B2 | 9/2020 | Fukuchi | |
| 10,991,660 B2 | 4/2021 | Wang et al. | |

(Continued)

FOREIGN PATENT DOCUMENTS

| | | |
|---|---|---|
| CN | 111755527 A | 10/2020 |
| TW | 202018880 A | 5/2020 |

*Primary Examiner* — Dale E Page
*Assistant Examiner* — Derek L Nielsen
(74) *Attorney, Agent, or Firm* — Chen-Chi Lin

(57) ABSTRACT

A semiconductor device comprises a semiconductor substrate, a plurality of metal layers, an adhesive layer, a compound layer, and a plurality of contact pads. A thickness of the semiconductor substrate is in a range from 15 μm to 35 μm. A thickness of the compound layer is larger than the thickness of the semiconductor substrate. A coefficient of thermal expansion of the compound layer is less than or equal to 9 ppm/° C. A glass transition temperature of the compound layer is larger than 150° C. The plurality of metal layers comprises a first titanium layer, a first nickel layer, a silver layer, a second nickel layer, and a metallic layer. In a first example, the metallic layer is a second titanium layer. In a second example, the metallic layer is a Titanium Nitride (TiN) layer.

17 Claims, 5 Drawing Sheets

(56) References Cited

U.S. PATENT DOCUMENTS

| | | | |
|---|---|---|---|
| 2016/0196932 A1* | 7/2016 | Chiem | H01G 11/24 29/25.03 |
| 2018/0204945 A1 | 7/2018 | Ryu et al. | |
| 2019/0006257 A1* | 1/2019 | Hsu | H01L 25/0652 |
| 2019/0148306 A1* | 5/2019 | Lin | H01L 21/22 438/530 |
| 2021/0125940 A1* | 4/2021 | Lu | H01L 21/6835 |

* cited by examiner

CHIP SCALE PACKAGE (CSP) SEMICONDUCTOR DEVICE HAVING THIN SUBSTRATE

FIELD OF THE INVENTION

This invention relates generally to a chip scale package (CSP) semiconductor device having a thin semiconductor substrate. More particularly, the present invention relates to a CSP semiconductor device, operative in a sufficient safety factor range, having a substrate with a thickness in a range from 15 microns to 35 microns.

BACKGROUND OF THE INVENTION

Reduction of power consumption of a battery of a mobile phone is crucial for a high charging current and ultra-low resistance application. Semiconductor device such as a common-drain metal-oxide-semiconductor field-effect transistor (MOSFET) or other power semiconductor devices in CSP for battery protection application and other power control applications usually have a semiconductor substrate thickness of 100 μm or more. For a vertical conduction semiconductor device, the thickness of the semiconductor substrate contributes a significant amount of DC resistance. It is advantageous to reduce the thickness of the semiconductor substrate to be less than 35 μm so as to reduce the DC resistance and to increase the electrical performance.

For a common-drain MOSFET device, the thickness of semiconductor substrate contributes a much more significant amount of direct-current (DC) resistance since the current passing through the substrate twice. It is more advantageous to reduce a thickness of the semiconductor substrate for improved electrical performance. For example, the on-resistance can be reduced by 24% when the thickness of the semiconductor substrate is reduced from 50 μm to 25 μm. The mechanical strength of the semiconductor device decreases when the semiconductor substrate thickness decreases.

To prevent damage to the thin wafer in packaging process and to maintain a sufficient mechanical strength of the packaged device in application, additional stiffness layers, including metal layers, carrier substrate layer and compound layer, are attached onto the wafer back surface after the process of wafer thickness reduction. Thick metal layer deposited on wafer back surface also helps to improve current conduction and reduce resistance. For example, the on-resistance can be reduced by 5% when the thickness of a plurality of back metal layers is increased from 15 microns to 50 microns. However, mismatches of thermal mechanical properties between the additional stiffness layers and the semiconductor substrate lead to excessive wafer warpage in semiconductor packaging process and excessive die warpage of packaged device when the semiconductor substrate layer is getting too thin.

On the wafer level, the effect of excessive warpage leads to low yield in device fabrication process. On the device level, the effect of excessive warpage leads to reliability issues due to excessive stress between different layers resulting in layer delamination or even die cracking when the device subjects to 245° C. of peak reflow temperature of wave soldering process in application. Such undesirable effects often require the substrate thickness being above 35 um so as to maintain a safety margin of the device mechanical strength, or to sacrifice the safety margin by reducing the mechanical strength using a substrate less than 35 um. FIG. 1A shows the die warpage measure of a prior art CSP device along two diagonal lines at peak reflow temperature of 245° C. The horizontal axis represents a distance away from a center of the CSP device while the vertical axis represents a displacement from a reference plane. Considering the CSP device having a dimension of 1.45×2.08 mm, the maximum displacement in the central area of the CSP device of 60 micron yields a maximum warpage of the semiconductor CSP device of more than 23 microns per millimeter in diagonal length. This is much higher than an industry desired limitation of 10 microns per millimeter in diagonal length. FIG. 1B shows the prior art CSP device subject to a bending test. A bending strength of the prior art device measured by a three-point bending test with 1.5-millimeter test span, at 25° C., is less than 1.5 Newton per millimeter in width. These test results indicate the prior art CSP device has poor mechanical property allowing excessive warpage and weak mechanical strength.

It is therefore a need to develop a wafer level back surface process capable of producing a CSP of power semiconductor device with substrate thickness less than or equal to 35 um and maintain sufficient device mechanical strength with low warpage that is less than 10 microns per millimeter in diagonal length, to meet the ever critical application demand.

SUMMARY OF THE INVENTION

A CSP semiconductor device comprises a semiconductor substrate, a metal layer stack, a compound layer, and a plurality of contact pads. A thickness of the semiconductor substrate is in a range from 15 μm to 35 μm. A thickness of the compound layer is larger than the thickness of the semiconductor substrate. A coefficient of thermal expansion of the compound layer is 9 ppm/° C. or less. A glass transition temperature of the compound layer is higher than 150° C. A bending strength of the CSP semiconductor device measured by a three-point bending test with 2-millimeter test span, at 25° C., is greater than or equal to 5 Newton per millimeter width. A maximum warpage of the CSP semiconductor device 100 at 245° C., solder reflow temperature, is less than 10 μm per diagonal length in mm.

The metal layer stack comprises a first titanium layer, a first nickel layer, a silver layer, a second nickel layer, and a metallic layer. In a first example, the metallic layer is a second titanium layer. In a second example, the metallic layer is a Titanium Nitride (TiN) layer.

DETAILED DESCRIPTION OF THE INVENTION

Figure 1A:
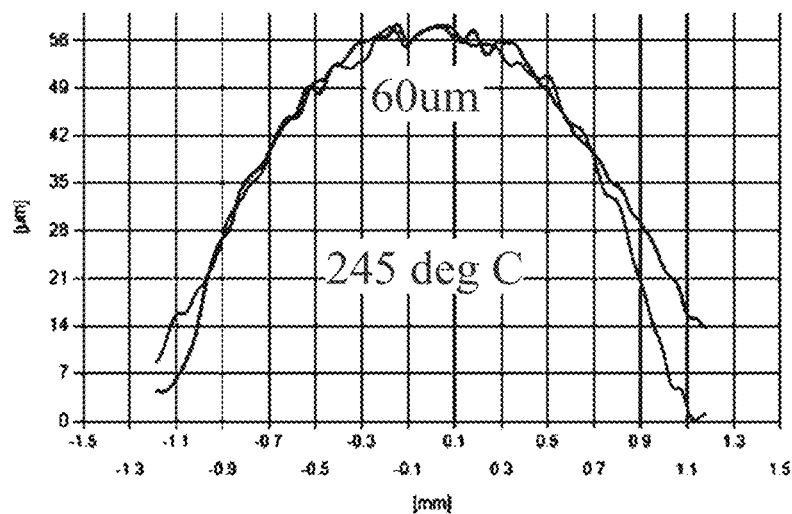
FIG. 1A is a measurement result of maximum warpage of a prior art CSP semiconductor device.
Figure 1B:
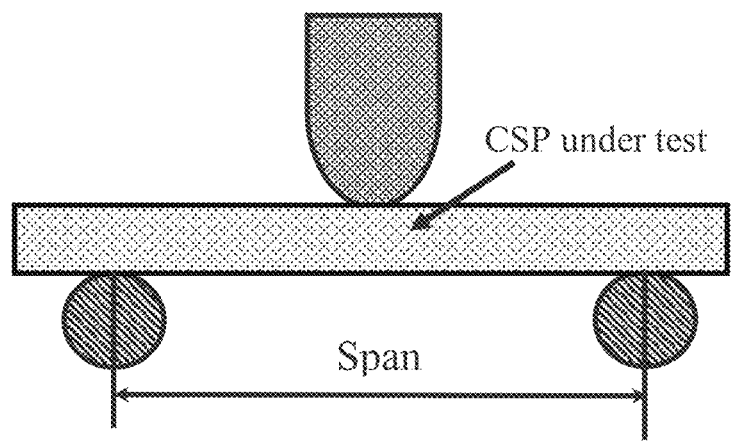
FIG. 1B is an illustration of a three-point bending test.
Figure 2:
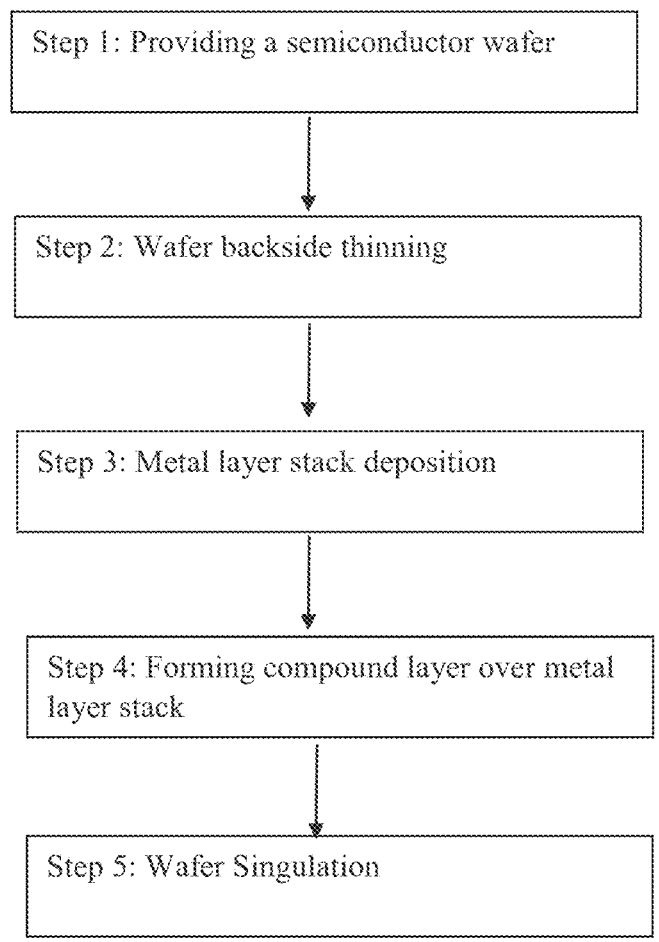
FIG. 2 is a flowchart of a wafer level back surface process to develop a CSP semiconductor device having a thin substrate in examples of the present disclosure.

FIG. 2 is a flowchart of a wafer level back surface process to develop a CSP semiconductor device having a thin substrate in examples of the present disclosure. In Step 1, a semiconductor wafer is provided. The semiconductor wafer comprises a front surface and a back surface opposite the front surface. A plurality of semiconductor devices are formed on a front surface of the semiconductor wafer.

In Step 2, a wafer thinning process is applied to the back surface of the semiconductor wafer. The thinning process reduces a thickness of a semiconductor substrate of the semiconductor wafer to 35 micron or less.

In Step 3, a metal layer stack is formed on a back surface of the thinned wafer. In examples of the present disclosure, Step 3 includes the following depositing steps. A first titanium layer having a thickness in a range from 1,000 angstroms to 2,000 angstroms is deposited onto the thinned wafer back surface. A first nickel layer having a thickness in a range from 2,000 angstroms to 3,000 angstroms is deposited onto the first titanium layer. A silver layer having a thickness in a range from 15 microns to 50 microns is deposited onto the first nickel layer. A second nickel layer having a thickness in a range from 2,000 angstroms to 3,000 angstroms is deposited onto the silver layer. A metallic layer, comprising titanium, having a thickness in a range from 1,000 angstroms to 2,000 angstroms is deposited onto the second nickel layer. In one example, the metallic layer is a titanium layer. In another example, the metallic layer is a titanium nitride layer.

In Step 4, a compound layer is formed onto the metallic layer. In examples of the present disclosure, the compound layer has a glass transition temperature higher than 150° C. and a coefficient of thermal expansion less than or equal to 9 ppm/° C. In examples of the present disclosure, the compound layer has a thickness of 200 microns or more.

In Step 5, a singulation process is applied to separate individual CSP device from the semiconductor wafer.

Figure 3:
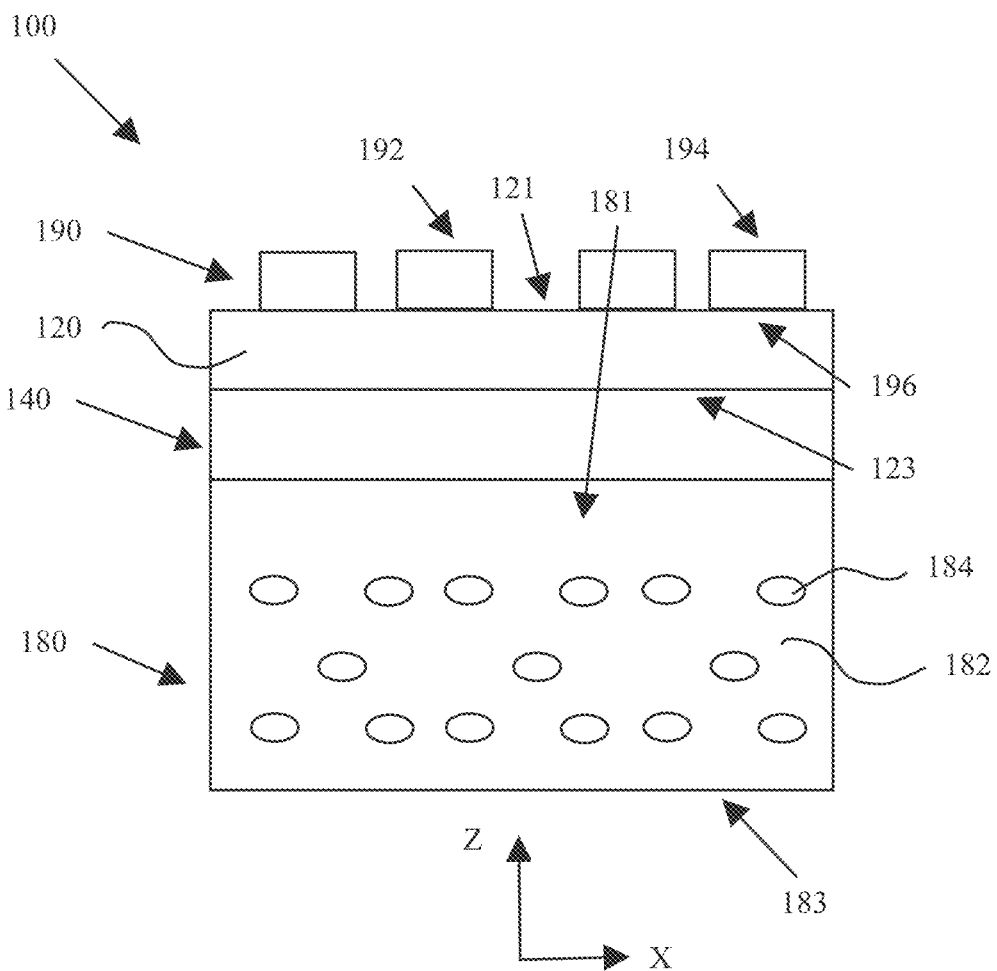
FIG. 3 shows a CSP semiconductor device in examples of the present disclosure.

FIG. 3 shows a CSP semiconductor device 100 in examples of the present disclosure. In one example, the CSP semiconductor device 100 is fabricated after the singulation process of Step 5 of FIG. 2. The CSP semiconductor device 100 comprises a semiconductor substrate 120, a metal layer stack 140, a compound layer 180, and a plurality of contact pads 190. The semiconductor substrate 120 has a front surface 121 and a back surface 123 opposite the front surface 121. The metal layer stack 140 comprises a plurality of metal layers disposed on the back surface 123 of the semiconductor substrate 120. The compound layer 180 is disposed on the metal layer stack 140. The plurality of contact pads 190 are disposed on the front surface 121 of the semiconductor substrate 120.

In one example, the CSP semiconductor device 100 is a power semiconductor device for current switching application. In another example, the CSP semiconductor device 100 is a common-drain metal-oxide-semiconductor field-effect transistor (MOSFET) CSP for battery protection application. The plurality of contact pads 190 includes two gate electrodes 192 and a plurality of source electrodes 194 on a front surface of the common-drain MOSFET CSP. A common-drain electrode is on a back surface 196 of the common-drain MOSFET CSP.

In one example, the semiconductor substrate 120 is made of a silicon material. The compound layer 180 has a front surface 181 and a back surface 183 opposite the front surface 181. The front surface 181 of the compound layer 180 is directly attached to the metal layer stack 140. The plurality of contact pads 190 are attached to the front surface 121 of the semiconductor substrate 120. In examples of the present disclosure, the plurality of contact pads 190 comprise a nickel material and a gold material. The metal layer stack 140 is between the semiconductor substrate 120 and the compound layer 180. In one example, a thickness of the semiconductor substrate 120 is in a range from 15 μm to 35 μm. In another example, a thickness of the semiconductor substrate 120 is in a range from 15 μm to 24 μm. In one example, a thickness of the metal layer stack 140 is larger than the thickness of the semiconductor substrate 120. In another example, a thickness of the compound layer 180 is more than three times larger than the thickness of the semiconductor substrate 120. A direction of thickness is along Z-axis of FIG. 3.

Challenges after reduction of the thickness of the semiconductor substrate 120 include delamination caused by excessive warpage of the CSP semiconductor device 100 at the solder reflow temperature. A specific combination of properly selected compound for the compound layer 180, properly pre-determined types of layers and properly pre-determined thicknesses of respective layers of a plurality of metal layers forming the metal layer stack 140 provide a solution for suppressing warpage of the CSP semiconductor device 100 at the solder reflow temperature. The metal layer stack 140 thus functions as an adhesive layer to maintain the integrity of the CSP semiconductor device 100 by strongly bonding together the compound layer 180 and the semiconductor substrate 120.

Figure 4:
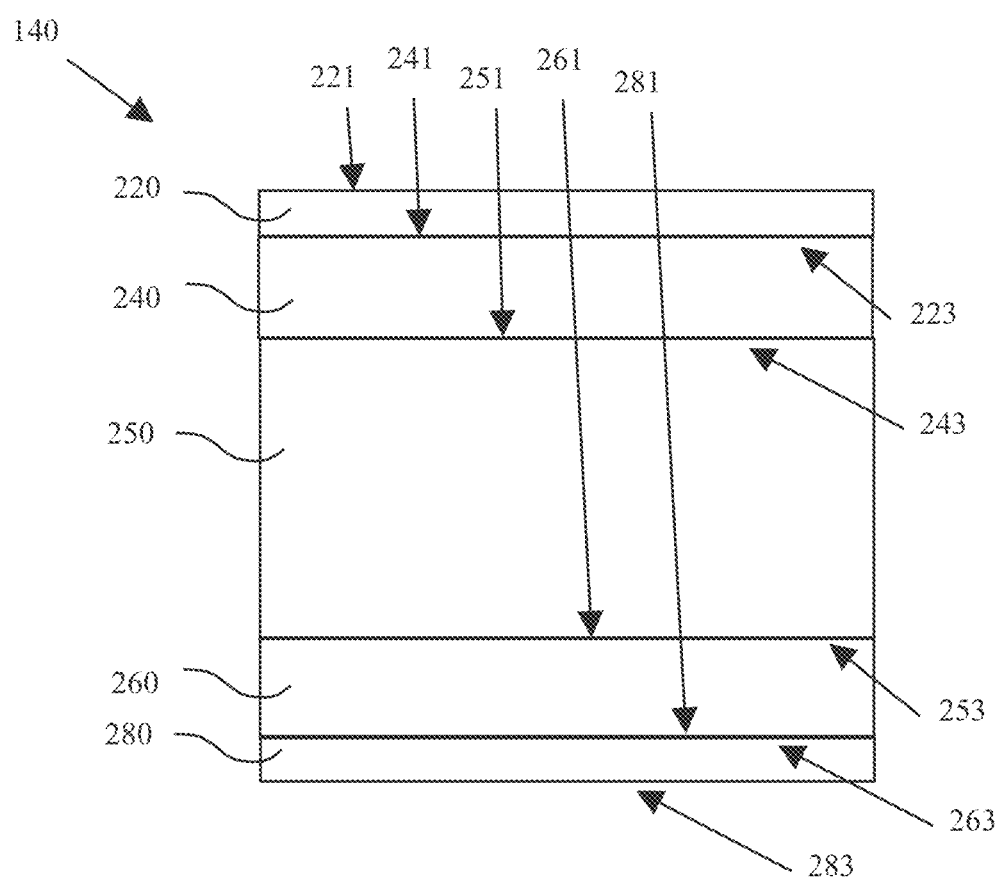
FIG. 4 shows a plurality of metal layers in a metal layer stack of a CSP semiconductor device in examples of the present disclosure.

FIG. 4 shows a plurality of metal layers forming the metal layer stack 140 of the CSP semiconductor device 100 of FIG. 3 in examples of the present disclosure. In one example, the plurality of metal layers comprises a first titanium layer 220, a first nickel layer 240, a silver layer 250, a second nickel layer 260, and a metallic layer 280 comprising titanium. The metallic layer 280 has a front surface 281 and a back surface 283 opposite the front surface 281. In a first example, the metallic layer 280 is a second titanium layer. In a second example, the metallic layer 280 is a Titanium Nitride (TiN) layer.

The first titanium layer 220 facilitates the bonding strength between the semiconductor substrate 120 and the metal layer stack 140. The first nickel layer 240 and the second nickel layer 260 facilitate the bonding strength between the silver layer 250 and adjacent layers. A thickness of the silver layer is larger than thicknesses of other layers of the metal layer stack 140 so as to improve the conductivity of the metal layer stack 140 allowing a larger transverse guide current. The metallic layer 280 being a second titanium layer or a TiN layer is because titanium is stable in a high temperature and high humidity environment and is less likely to be oxidized. The thicknesses of nickel layers and titanium layers should not be too thick so as to suppress stresses. The thicknesses of nickel layers and titanium layers should not be too thin so as to maintain bonding strengths. Each of the plurality of metal layers of the metal layer stack 140 may be formed by evaporation methods or sputtering methods. The temperature during the process of metal deposition is reduced so as to reduce the metal grain size; and to reduce the stress and warpage of the chips.

Referring now to FIGS. 3 and 4, the first titanium layer 220 has a front surface 221 and a back surface 223 opposite the front surface 221. The front surface 221 of the first titanium layer 220 is directly attached to the back surface 123 of the semiconductor substrate 120. The first nickel layer 240 has a front surface 241 and a back surface 243 opposite the front surface 241. The front surface 241 of the first nickel layer 240 is directly attached to the back surface 223 of the first titanium layer 220. The silver layer 250 has a front surface 251 and a back surface 253 opposite the front surface 251. The front surface 251 of the silver layer 250 is directly attached to the back surface 243 of the first nickel layer 240.

The second nickel layer 260 has a front surface 261 and a back surface 263 opposite the front surface 261. The front surface 261 of the second nickel layer 260 is directly attached to the back surface 253 of the silver layer 250.

In a first example, the metallic layer 280 is a second titanium layer. The front surface of the second titanium layer is directly attached to the back surface 263 of the second nickel layer 260. The front surface 181 of compound layer 180 is directly attached to the back surface of the second titanium layer.

In examples of the present disclosure, a thickness of the first titanium layer 220 is in a range from 1,000 angstroms to 2,000 angstroms. A thickness of the first nickel layer 240 is in a range from 2,000 angstroms to 3,000 angstroms. A thickness of the silver layer 250 is in a range from 15 μm to 50 μm. A thickness of the second nickel layer 260 is in a range from 2,000 angstroms to 3,000 angstroms. A thickness of the second titanium layer is in a range from 1,000 angstroms to 2,000 angstroms.

In examples of the present disclosure, a thickness of the first titanium layer 220 is the same as a thickness of the second titanium layer. A thickness of the first nickel layer 240 is the same as a thickness of the second nickel layer 260.

In a second example, the metallic layer 280 is a TiN layer. The front surface of the TiN layer is directly attached to the back surface 263 of the second nickel layer 260. The front surface 181 of compound layer 180 is directly attached to the back surface of the TiN layer.

In examples of the present disclosure, a thickness of the first titanium layer 220 is in a range from 1,000 angstroms to 2,000 angstroms. A thickness of the first nickel layer 240 is in a range from 2,000 angstroms to 3,000 angstroms. A thickness of the silver layer 250 is in a range from 15 μm to 50 μm. A thickness of the second nickel layer 260 is in a range from 2,000 angstroms to 3,000 angstroms. A thickness of the TiN layer is in a range from 1,000 angstroms to 2,000 angstroms.

In examples of the present disclosure, the compound layer 180 comprises a resin material 182 and a filler material 184. In one example, the resin material 182 is an epoxy resin. In one example, the compound layer 180 is 5%-30% filled with the filler material 184. To suppress delamination and to reduce the warpage of the CSP semiconductor device 100 at solder reflow temperature, a coefficient of thermal expansion of the compound layer 180 is less than or equal to 9 ppm/° C. because a filler material 184 of high thermal conductivity is used thereby heat dissipation capacity of the compound layer 180 is at least 15% better than that of a wafer backside protective tape. A glass transition temperature of the compound layer is higher than 150° C.

In examples of the present disclosure, a thickness of the compound layer is larger than 200 μm so as to reduce the warpage of the CSP semiconductor device 100 at solder reflow temperature.

In examples of the present disclosure, a bending strength of the CSP semiconductor device 100 measured by a three-point bending test with 2-millimeter test span, at 25° C., is greater than or equal to 5 Newton per millimeter in width. The test loading is inversely proportional to the test span. For example, a bending strength of the CSP semiconductor device 100 measured by a three-point bending test with 1.5-millimeter test span, at 25° C., is greater than 8 Newton per millimeter in width.

Figure 5:
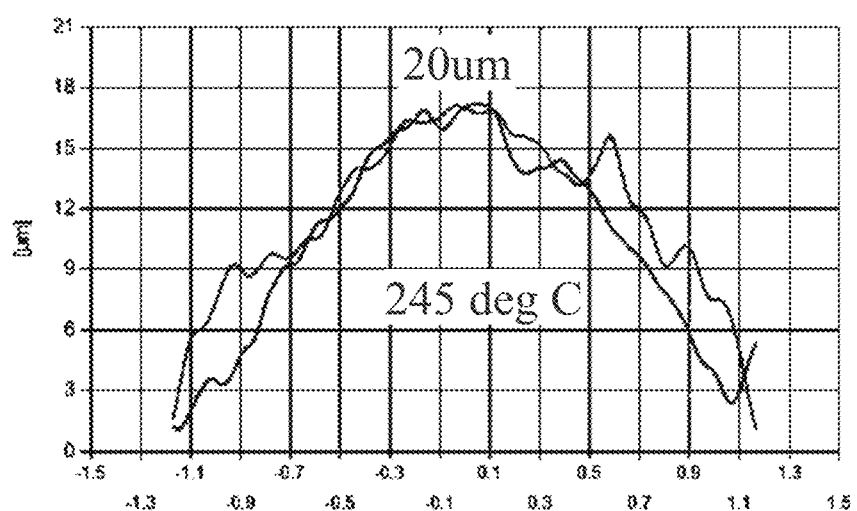
FIG. 5 is a measurement result of maximum warpage of a CSP semiconductor device fabricated by the method of FIG. 2 in examples of the present disclosure.

In examples of the present disclosure, the CSP semiconductor device 100 is of a rectangular prism shape. A diagonal length of the CSP semiconductor device 100 refers to a diagonal length of the back surface 183 of the compound layer 180. Warpage measurements are along two diagonal lines of the back surface 183 of the compound layer 180. As shown in FIG. 5, for a CSP device having a dimension of 1.45×2.08 mm, the maximum displacement in the central area of the CSP device according to one example of the present disclosure is less than 20 microns. The measured warpage of the CSP semiconductor device 100, at 245° C., solder reflow temperature, is less than 7.87 μm per mm in diagonal length.

Those of ordinary skill in the art may recognize that modifications of the embodiments disclosed herein are possible. For example, a thickness of the silver layer 250 may vary. Other modifications may occur to those of ordinary skill in this art, and all such modifications are deemed to fall within the purview of the present invention, as defined by the claims.

The invention claimed is:
1. A chip scale package (CSP) semiconductor device comprising:
 a semiconductor substrate having a front surface and a back surface opposite the front surface of the semiconductor substrate;
 a plurality of contact pads attached to the front surface of the semiconductor substrate;
 a metal layer stack attached to the back surface of the semiconductor substrate, the metal layer stack comprising a first titanium layer;
 a first nickel layer;
 a silver layer;
 a second nickel layer; and
 a metallic layer comprising titanium; and
 a compound layer attached to the metal layer stack;
 wherein a thickness of the semiconductor substrate is less than or equal to 35 microns;
 wherein the first titanium layer, the first nickel layer, the silver layer, the second nickel layer, and the metallic layer are in sequence;
 wherein the compound layer comprises
 a resin material; and
 a filler material;
 wherein a coefficient of thermal expansion of the compound layer is less than or equal to 9 ppm/° C.;
 wherein a glass transition temperature of the compound layer is larger than 150° C.; and
 wherein a bending strength of the semiconductor device measured by a three-point bending test with two-millimeter test span, at 25° C., is greater than or equal to 5 Newton per millimeter in width.

2. The CSP semiconductor device of claim 1, wherein
 the first titanium layer has a front surface and a back surface opposite the front surface of the first titanium layer;
 the front surface of the first titanium layer is directly attached to the back surface of the semiconductor substrate;
 the first nickel layer has a front surface and a back surface opposite the front surface of the first nickel layer;
 the front surface of the first nickel layer is directly attached to the back surface of the first titanium layer; and
 the silver layer has a front surface and a back surface opposite the front surface of the silver layer;

the front surface of the silver layer is directly attached to the back surface of the first nickel layer;

the second nickel layer has a front surface and a back surface opposite the front surface of the second nickel layer; and the front surface of the second nickel layer being directly attached to the back surface of the silver layer.

3. The CSP semiconductor device of claim 2, wherein the metallic layer comprises a second titanium layer having a front surface and a back surface opposite the front surface of the second titanium layer, the front surface of the second titanium layer being directly attached to the back surface of the second nickel layer;

wherein a front surface of the compound layer is directly attached to the back surface of the second titanium layer.

4. The CSP semiconductor device of claim 3, wherein a thickness of the first titanium layer is in a range from 1,000 angstroms to 2,000 angstroms;

wherein a thickness of the first nickel layer is in a range from 2,000 angstroms to 3,000 angstroms;

wherein a thickness of the silver layer is in a range from 15 microns to 50 microns;

wherein a thickness of the second nickel layer is in a range from 2,000 angstroms to 3,000 angstroms; and wherein a thickness of the second titanium layer is in a range from 1,000 angstroms to 2,000 angstroms.

5. The CSP semiconductor device of claim 3, wherein a thickness of the first titanium layer is the same as a thickness of the second titanium layer; and wherein a thickness of the first nickel layer is the same as a thickness of the second nickel layer.

6. The CSP semiconductor device of claim 2, wherein the metallic layer comprises a titanium nitride layer having a front surface and a back surface opposite the front surface of the titanium nitride layer, the front surface of the titanium nitride layer being directly attached to the back surface of the second nickel layer;

wherein a front surface of the compound layer is directly attached to the back surface of the titanium nitride layer.

7. The CSP semiconductor device of claim 6, wherein a thickness of the first titanium layer is in a range from one thousand angstroms to two thousand angstroms;

wherein a thickness of the first nickel layer is in a range from 2,000 angstroms to 3,000 angstroms;

wherein a thickness of the silver layer is in a range from 15 microns to 50 microns;

wherein a thickness of the second nickel layer is in a range from 2,000 angstroms to 3,000 angstroms; and wherein a thickness of the titanium nitride layer is in a range from 1,000 angstroms to 2,000 angstroms.

8. The CSP semiconductor device of claim 1, wherein a thickness of the compound layer is larger than 200 microns.

9. The CSP semiconductor device of claim 1, wherein a maximum warpage of the semiconductor device at 245° C. is less than 10 microns per millimeter in diagonal length.

10. The CSP semiconductor device of claim 1, wherein the semiconductor substrate is made of a silicon material.

11. The CSP semiconductor device of claim 1, wherein a thickness of the metal layer stack is larger than the semiconductor substrate.

12. The CSP semiconductor device of claim 1, wherein a thickness of the compound layer is at least three times larger than the semiconductor substrate.

13. The CSP semiconductor device of claim 1, wherein the metal layer stack is between the semiconductor substrate and the compound layer.

14. The CSP semiconductor device of claim 1, wherein the CSP semiconductor device is a common-drain metal-oxide-semiconductor field-effect transistor (MOSFET) CSP for battery protection application;

wherein the plurality of contact pads include two gate electrodes and a plurality of source electrodes on a front surface of the common-drain MOSFET CSP; and wherein a common-drain electrode is on a back surface of the common-drain MOSFET CSP.

15. The CSP semiconductor device of claim 1, wherein heat dissipation capacity of the compound layer is at least 15% better than that of a wafer backside protective tape.

16. The CSP semiconductor device of claim 1, wherein the compound layer comprises a resin material; and a filler material;

wherein the compound layer is 5%-30% filled with the filler material.

17. The CSP semiconductor device of claim 1, wherein the metallic layer comprises a titanium nitride layer; and wherein a front surface of the compound layer is directly attached to a back surface of the titanium nitride layer.

* * * * *